US007842611B2

(12) United States Patent
Shimizu (10) Patent No.: US 7,842,611 B2
(45) Date of Patent: Nov. 30, 2010

(54) SUBSTRATE AND MANUFACTURING METHOD OF THE SAME

(75) Inventor: Yoshiaki Shimizu, Kadoma (JP)

(73) Assignee: Panasonic Corporation, Osaka (JP)

( * ) Notice: Subject to any disclaimer, the term of this patent is extended or adjusted under 35 U.S.C. 154(b) by 166 days.

(21) Appl. No.: 12/343,740

(22) Filed: Dec. 24, 2008

(65) Prior Publication Data

US 2009/0179305 A1   Jul. 16, 2009

(30) Foreign Application Priority Data

Jan. 15, 2008   (JP)   ............................... 2008-005135

(51) Int. Cl.
  *H01L 21/768*   (2006.01)
(52) U.S. Cl. ................ 438/667; 438/612; 257/E21.597
(58) Field of Classification Search ................ 438/612, 438/616, 666, 667; 29/829; 205/125; 257/E21.597
  See application file for complete search history.

(56) References Cited

U.S. PATENT DOCUMENTS

| 6,506,982 | B1 | 1/2003 | Shigi et al. .................. 174/264 |
| 7,355,273 | B2 * | 4/2008 | Jackson et al. ............. 257/686 |
| 2002/0157958 | A1 | 10/2002 | Kikuchi et al. ............. 205/118 |

FOREIGN PATENT DOCUMENTS

JP   58-110094   6/1983

* cited by examiner

*Primary Examiner*—Thanhha Pham
(74) *Attorney, Agent, or Firm*—Steptoe & Johnson LLP (57) ABSTRACT

According to the present invention, on a double-sided substrate 1, a plurality of through-holes 2 connected to one wire 6 for plating as well as wiring are collectively arranged within a narrow range close to the connection portion. After a plating process, a penetrating hole 12 is formed and the connection potion is cut off. Thus, the wire 6 for plating and the collectively arranged through-holes 2 are made independent of one another so that no electric conduction occurs among the wire 6 for plating and the through-holes 2.

19 Claims, 7 Drawing Sheets

PRIOR ART

FIG. 13

PRIOR ART

FIG. 14

PRIOR ART

SUBSTRATE AND MANUFACTURING METHOD OF THE SAME

FIELD OF THE INVENTION

The present invention relates to a high-density wiring technique for a substrate used as a semiconductor device in a BGA semiconductor device or an LGA semiconductor device.

BACKGROUND OF THE INVENTION

In the first conventional method of providing a high-density substrate used as a semiconductor device in a BGA (Ball Grid Array: hereinafter simply referred to as the EGA) semiconductor device or an LGA (Land Grid Array: hereinafter simply referred to as the LGA) semiconductor device, a laminate substrate is used to provide an intermediate wiring layer between a first surface and a second surface of a substrate. In addition to providing wires onto the first surface and the second surface, wires are routed via the intermediate wiring layer to secure the wiring area and provide a high-density substrate.

In the second method, the diameter of a through-hole is reduced to secure the area and to provide the through-hole with multiple functions.

A conventional technique for providing a through-hole with multiple functions (see, for example, Japanese Patent Laid-Open No. 58-110094) will be described below.

The conventional technique includes a method of forming one through-hole and a plurality of independent lands and wires around the through-hole, subjecting a substrate to electroless plating, and then cutting a plated portion inside the through-hole. In this case, a small-sized through-hole requires an advanced processing technique for subsequently dividing the inside of the through-hole.

In recent years, in double-sided substrates, which are often used as wiring substrates for semiconductor devices, there has been an increasing demand for regulating arrangement of wires for plating and conducting wires in response to an increased number of pins, as well as wire routing in response to an increased number of through-holes and improvement in the accuracy of electrical characteristics.

In connection with the above description, a typical substrate design will be described below with reference to the drawings.

Figure 12:
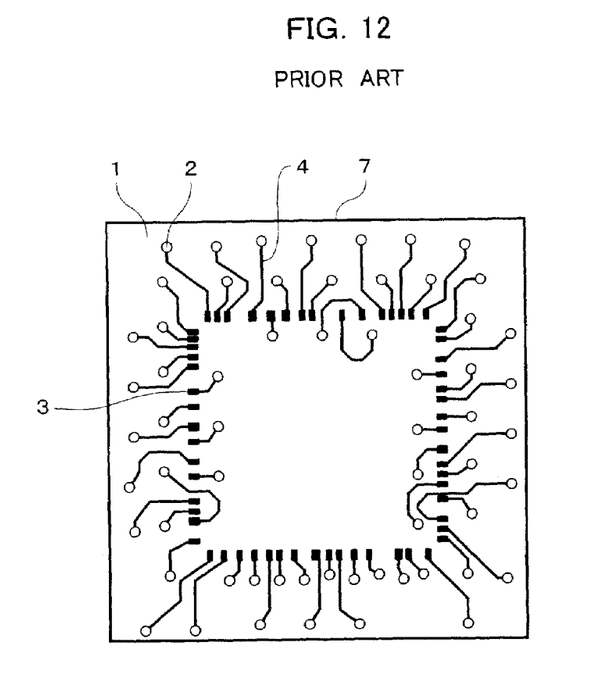
FIG. 12 is a plan view showing a first surface of a conventional substrate.
Figure 13:
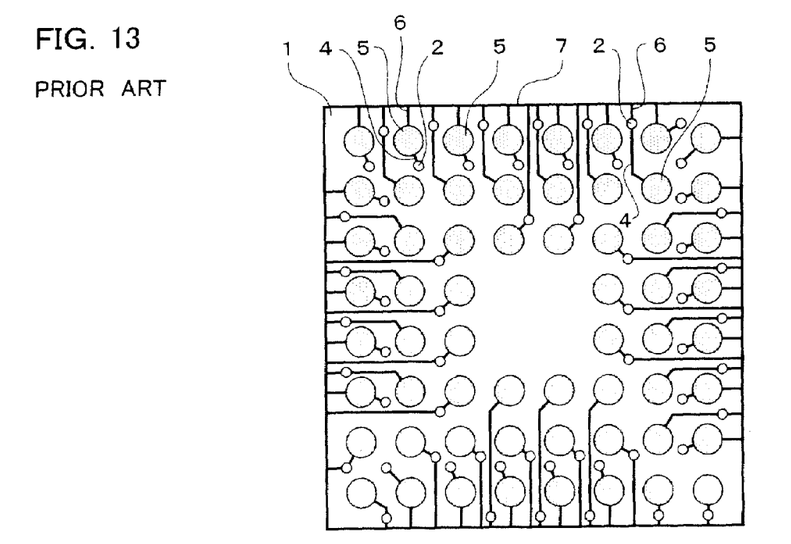
FIG. 13 is a plan view showing a second surface of the conventional substrate.
Figure 14:
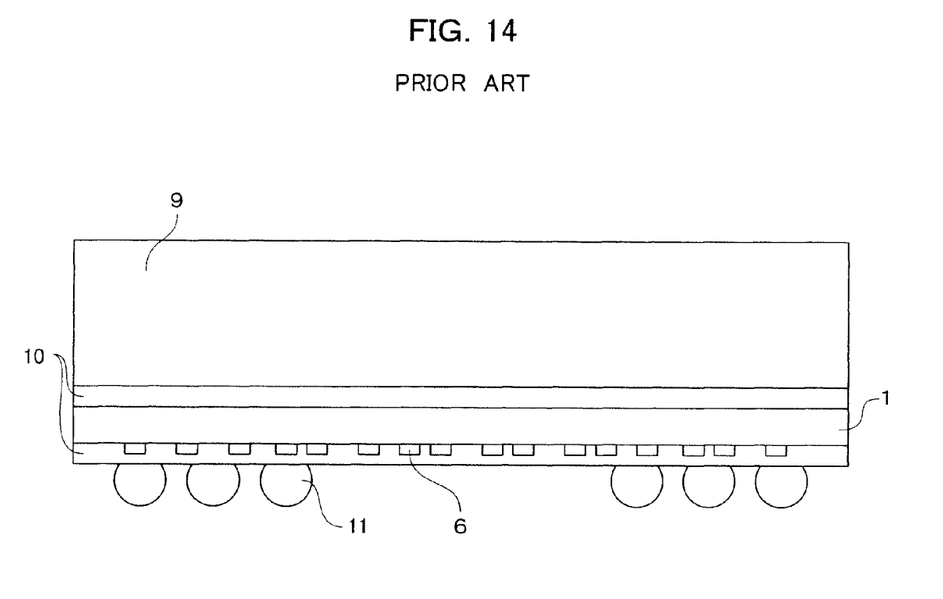
FIG. 14 is a side view showing the appearance of a semiconductor device using the conventional substrate.

FIG. 12 is a plan view showing the first surface of a conventional substrate. FIG. 13 is a plan view showing the second surface of the conventional substrate. FIG. 14 is a side view showing the appearance of a semiconductor device using the conventional substrate.

In FIGS. 12, 13, and 14, reference numerals 1, 2, and 3 denote a substrate, a through-hole, and an internal terminal, respectively. Reference numerals 4, 5, and 6 denote a conducting wire, an external terminal electrode, and a wire for plating, respectively. Reference numerals 7, 9, 10, and 11 denote an outer peripheral wire for plating, a molding resin, a resist, and a solder ball, respectively.

The conventional substrate 1 is a double-sided substrate including, as electric wiring making up an internal circuit, a plurality of pairs of the internal terminal 3 and the conducting wire 4, which are connected together, arranged on the first surface as shown in FIG. 12 and a plurality of sets each made up of one external terminal electrode 5, one conducting wire 4, and one through-hole 2, which are connected together, arranged on the second surface opposite to the first surface as shown in FIG. 13. Moreover, to allow all the electric wires to be electrically connected together into one conducting wire so as to be subjected to an electroplating process at a time, the outer peripheral wire 7 for plating and multiple wires 6 for plating are arranged on the second surface as shown in FIG. 13; the wires 6 for plating are formed so as to be connected to the outer peripheral wire 7 for plating and each electrically connected to one set of the external terminal electrode 5 and the through-hole 2.

In the semiconductor device using the substrate 1, an increase in the number of pins increases the number of electric wires arranged so as to make up the internal circuit. This complicates the arrangement of the conducting wire 4 and the through-hole 2, limiting a design space. As a result, the degree of freedom for design of a double-sided substrate decreases significantly.

To avoid this problem, a laminate substrate may be used. However, since the laminate substrate increases costs, a method of improving for maximizing the design space for a double-sided substrate is required.

Furthermore, collective resin molding is generally used for the BGA semiconductor device and the LGA semiconductor device. In this case, after the collective molding, the resulting substrate is divided into individual semiconductor devices. Simultaneously with the division, the outer peripheral wire 7 for plating is cut off, and the wires 6 for plating electrically connected to the outer peripheral wire 7 for plating are also cut off for division and disconnected from the outer peripheral wire 7 for plating.

In the semiconductor devices resulting from the division, as shown in FIG. 14, the wires 6 for plating electrically connected to the internal circuit are exposed from a side surface of the semiconductor device. Thus, in the handling of the semiconductor device, static electricity may be applied to the internal circuit through the exposed portions of the wires 6 for plating, or when the semiconductor device is mounted, an adjacent electronic component or mounting solder may contact the exposed portions of the wires 6 for plating. This results in an electrical defect, preventing products from maintaining acceptable quality.

DISCLOSURE OF THE INVENTION

The present invention solves the above-described problems. An object of the present invention is to provide a substrate and a method of manufacturing the substrate which achieves high-density wiring on a double-sided substrate, which enables inhibition of an increase in costs, while increasing the degree of freedom for designing the double-sided substrate and further improving product quality.

To accomplish the object, a method of manufacturing a substrate according to the present invention includes the steps of forming, on the first surface of a substrate, a plurality of internal terminals and a first conducting wire for electric connection to the internal terminals, forming, on the second surface of the substrate opposite to the first surface, a plurality of external terminal electrodes and a second conducting wire for electric connection to the external terminal electrodes, and forming a plurality of through-holes electrically connecting the first conducting wire to the second conducting wire, in a region surrounded by the external terminal electrodes so that the through-holes are collectively arranged in the region; forming an outer peripheral wire for plating on the peripheral portion of the substrate, forming at least one wire for plating extending from the outer peripheral wire for plating to electrically connect the outer peripheral wire for plating and the collectively arranged plurality of through-holes together so that the wire for plating is connected to the through-holes at one position thereof, and electrically connecting the outer peripheral wire for plating, the first conducting wire and the second conducting wire together through the wire for plating and then subjecting the outer peripheral wire for plating, the first conducting wire, the second conducting wire and the wire for plating to electroplating; and forming a penetrating hole at the one position of the wire for plating and cutting the one position off to make the wire for plating and the collectively arranged plurality of through-holes independent of each other as different wires so that no electric conduction occurs among the wire for plating and the through-holes.

Furthermore, the step of forming the at least one wire for plating so that the at least one wire for plating is connected to the through holes at the one position thereof is forming the at least one wire for plating so that the at least one wire for plating branches at the one position in the middle of the wire and then connects to the respective through-holes, and the step of forming the penetrating hole at the one position of the wire for plating and cutting the one position off is forming the penetrating hole in the branching portion of the wire for plating and cutting the branching portion off.

Furthermore, the step of forming the at least one wire for plating so that the at least one wire for plating is connected to the through holes at the one position thereof is forming the at least one wire for plating such that one of the through-holes is connected to the wiring end of the wire for plating and such that a through-hole land of the one of the through-holes is connected to through-hole lands of the other through-holes connected to the external terminal electrodes and located adjacent to the one of the through-holes so that the wire for plating is connected to the through-holes at the one position thereof, and the step of forming the penetrating hole at the one position of the wire for plating and then cutting the one position off is forming the penetrating hole in a region extending from the central position among all the through-holes connected to the wire for plating to the outer periphery of junction portions between the through-hole lands, and then cutting the central portion among all the through-holes.

Furthermore, a method of manufacturing a substrate according to the present invention includes the steps of forming, on the first surface of a substrate, a plurality of internal terminals and a first conducting wire for electric connection to the internal terminals, forming, on the second surface of the substrate opposite to the first surface, a plurality of external terminal electrodes and a second conducting wire for electric connection to the external terminal electrodes, and forming a plurality of first through-holes electrically connecting the first conducting wire to the second conducting wire, in a region surrounded by the external terminal electrodes so that the first through-holes are collectively arranged in the region; forming an outer peripheral wire for plating on the peripheral portion of the first surface, forming at least one wire for plating extending from the outer peripheral wire for plating to electrically connect the outer peripheral wire for plating and the collectively arranged plurality of first through-holes together so that the wire for plating branches on the second surface at one position in the middle of the wire via a second through-hole and then connects to the respective first through-holes, and electrically connecting the outer peripheral wire for plating, the first conducting wire and the second conducting wire together through the wire for plating and then subjecting the outer peripheral wire for plating, the first conducting wire, the second conducting wire and the wire for plating to electroplating; and forming a penetrating hole in the second through-hole portion of the wire for plating and cutting the second through-hole portion off to make the wire for plating and the collectively arranged plurality of first through-holes independent of each other as different wires so that no electric conduction occurs among the wire for plating and the first through-holes.

Furthermore, the penetrating hole is formed by drilling so that the inner diameter of the penetrating hole is equivalent to or larger than a through-hole diameter.

Furthermore, the penetrating hole is formed by laser processing so that the inner diameter of the penetrating hole is equivalent to or larger than the through-hole diameter.

Furthermore, the penetrating hole is formed in the substrate with a thickness of 0.5 mm or less.

Furthermore, the substrate includes a penetrating hole formed at one position of the wire for plating after an electroplating process carried out through the outer peripheral wire for plating, and the wire for plating and the collectively arranged plurality of through-holes are made independent of one another as different wires so that no electric conduction occurs among the wire for plating and the through-holes.

Furthermore, the substrate includes a penetrating hole formed at one position of the wire for plating after an electroplating process carried out through the outer peripheral wire for plating, and the wire for plating and the collectively arranged plurality of through-holes are made independent of one another as different wires so that no electric conduction occurs among the wire for plating and the through-holes.

Furthermore, the substrate includes a penetrating hole formed in the second through-hole portion of the wire for plating after an electroplating process carried out through the outer peripheral wire for plating, and the wire for plating and the collectively arranged plurality of first through-holes are made independent of one another as different wires so that no electric conduction occurs among the wire for plating and the first through-holes.

As described above, according to the present invention, every plurality of through-holes scattered around for the electric connection between the first surface and second surface of the substrate are collectively arranged in the portion close to the external terminal electrode. One wire for plating is connected to the collectively arranged through-holes, so that electroplating (Au plating or solder plating) can be carried out on the plurality of conducting wires, external terminal electrode, and internal terminal at a time with the reduced number of wires for plating. This ensures a space on the substrate in which the wires can be routed.

Furthermore, by collectively arranging the plurality of through-holes connected to the wire for plating and the conducting wire in the narrow range close to the connection portion, and cutting the connection portion off after the plating process, the wire for plating and the through-holes collectively arranged are made independent of one another so that no electric conduction occurs among the wire for plating and the through-holes. This prevents the wire for plating exposed from a side surface of each semiconductor device resulting from division from being electrically connected to the other conducting wires and through-holes formed on the substrate. This in turn enables prevention of application of static electricity through the exposed wire for plating and of a possible electrical problem associated with mounting.

As a result, the present invention achieves high-density wiring on a double-sided substrate, which enables inhibition of an increase in costs, while increasing the degree of freedom for designing the double-sided substrate and further improving the product quality.

DESCRIPTION OF THE EMBODIMENTS

Substrates and methods of manufacturing the substrates will be specifically described below with reference to the drawings.

Embodiment 1

A substrate and a method of manufacturing the substrate according to Embodiment 1 of the present invention will be described.

Figure 1:
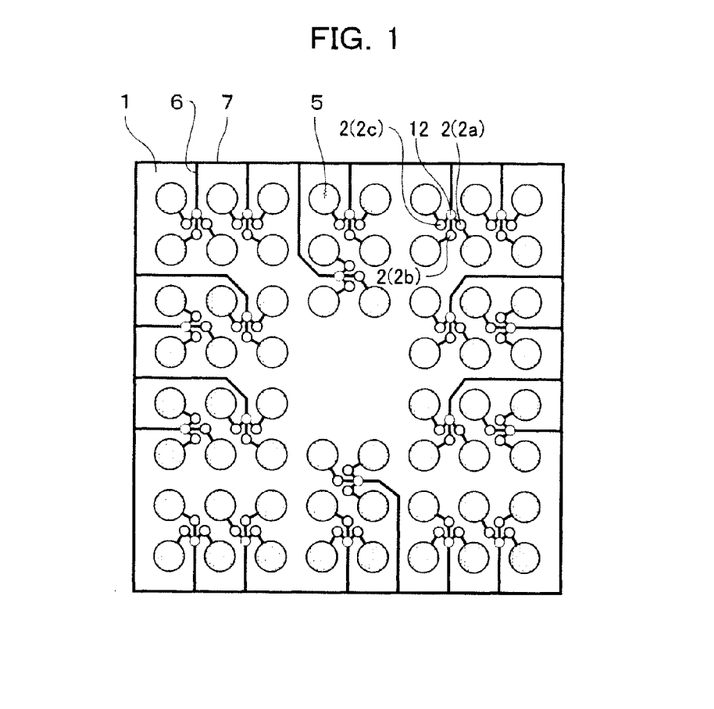
FIG. 1 is a plan view showing the structure of a substrate according to Embodiment 1 of the present invention.
Figure 2:
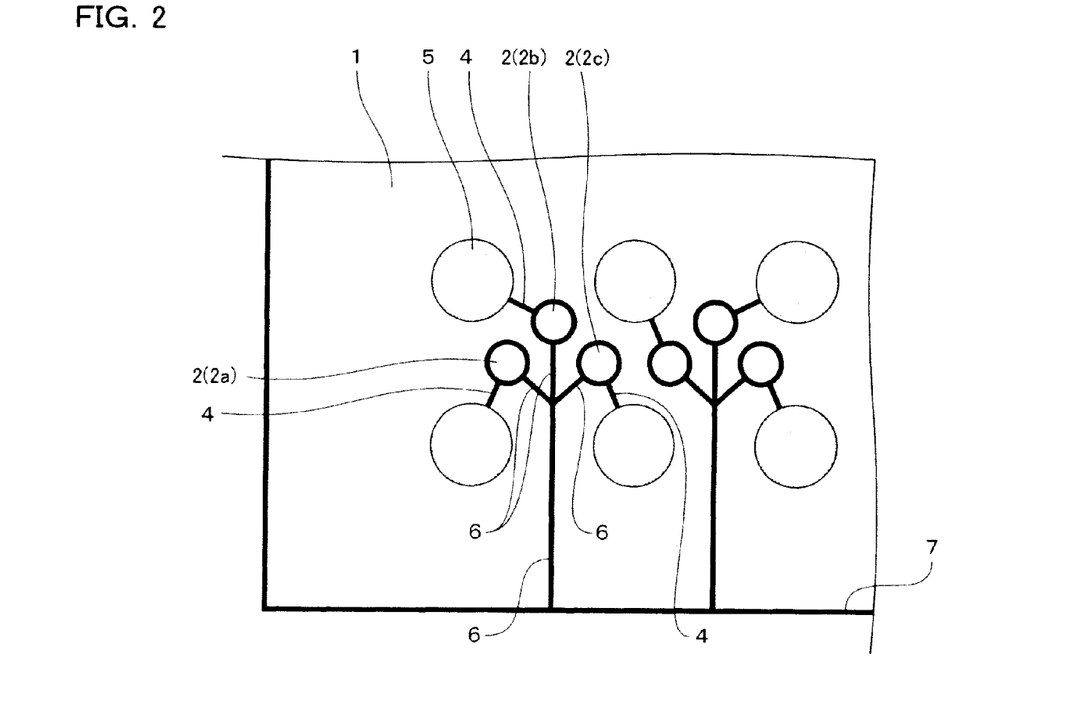
FIG. 2 is a partly enlarged plan view of the substrate according to Embodiment 1 of the present invention before wire cutting.
Figure 3:
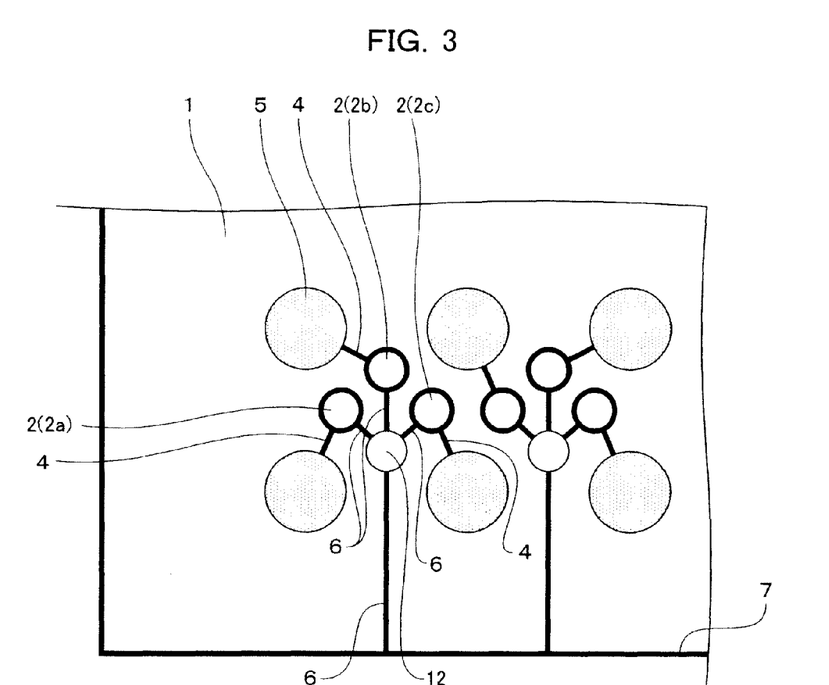
FIG. 3 is a partly enlarged plan view of the substrate according to Embodiment 1 of the present invention after the wire cutting.

FIG. 1 is a plan view showing the structure of the substrate according to Embodiment 1; the plan view shows a substrate portion in a region to be finally incorporated into one semiconductor device. FIG. 2 is a partly enlarged plan view of the substrate according to Embodiment 1 of the present invention before wire cutting. FIG. 3 is a partly enlarged plan view of the substrate according to Embodiment 1 of the present invention after the wire cutting.

In the step of producing a substrate, a conductive metal thin film (Cu) is stuck to a first surface and a second surface of the substrate. Holes to be finally formed into through-holes 2 shown in FIG. 1 are formed on the substrate. Then, the interior of each of the holes is plated with the same metal material (Cu) as that of the metal thin film stuck to the surfaces of the substrate. The surfaces of the substrate are subsequently subjected to pattern printing that allows various wires to be formed. Parts of the metal thin film (Cu) other than required wiring patterns are removed. Thus, as shown in FIG. 2, external terminal electrodes 5, the through-holes 2, a wire 6 for plating, and a conducting wire 4 are formed on the second surface of the substrate 1. Although not shown, internal terminals and conducting wires similar to those in the conventional art are formed on the first surface of the substrate. Finally, the wiring patterns on each of the first and second surfaces are plated with metal (for example, Ni—Au plating, Au plating, or solder plating).

In this case, the wire 6 for plating is arranged on the second surface so as to be connected to an outer peripheral wire 7 for plating. However, the wire 6 for plating and the outer peripheral wire 7 for plating may be arranged on the first surface.

The configuration of the substrate 1 and the method of manufacturing the substrate 1 described so far are the same as those in the conventional substrate producing step. However, Embodiment 1 offers the following design features. As shown in FIG. 2, through-holes 2a, 2b, and 2c are collectively arranged on the second surface in the vicinity of the respective external terminal electrodes 5 so as to be surrounded by the adjacent external terminal electrodes 5 to reduce a distance between each of the through-holes 2a, 2b, and 2c and the corresponding external terminal electrode 5 connected to the through-hole through the conducting wire 4. A through-hole 2a, 2b, 2c side of the wire 6 for plating includes a portion in which the wire 6 for plating branches at one position in the middle thereof, so as to connect the wire 6 for plating connected to the outer peripheral wire 7 for plating to the collectively arranged through-holes 2a, 2b, and 2c.

Then, after the metal plating process is carried out on the wiring patterns, a penetrating hole 12 is formed in the portion of the wire 6 for plating in which the wire 6 for plating branches at one position in the middle thereof, to cut and separate the wire 6 for plating in the branching portion as shown in FIGS. 1 and 3. This prevents possible electric conduction among the wire 6 for plating and the through-holes 2a, 2b, and 2c.

Subsequently, the substrate 1 is coated with a resist. The resist is then removed from portions to be exposed which correspond to the internal terminals on the first surface and the external terminal electrodes on the second surface, to complete the substrate. At this time, the resist is placed and buried in the through-holes 2 and the penetrating hole 12.

Embodiment 2

A substrate and a method of manufacturing the substrate according to Embodiment 2 of the present invention will be described.

Figure 4:
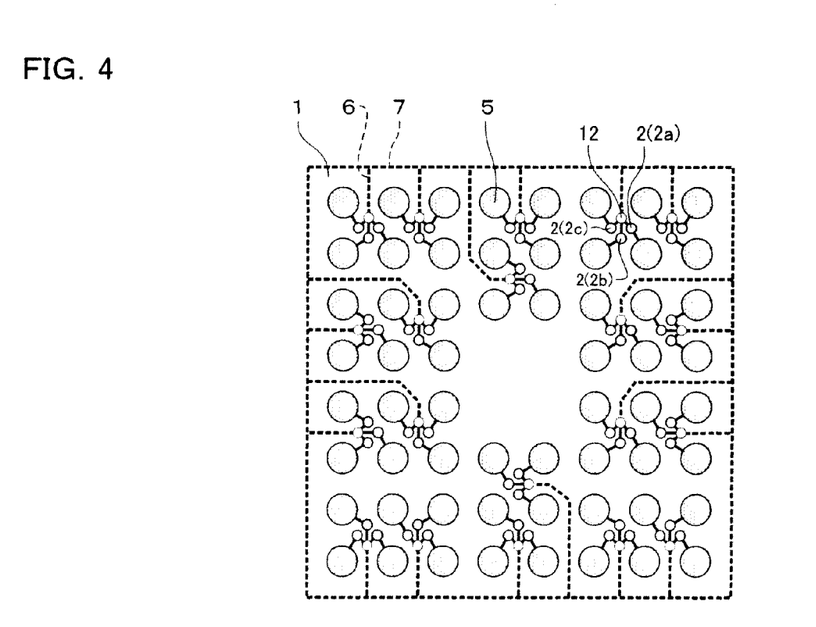
FIG. 4 is a plan view showing the structure of a substrate according to Embodiment 2 of the present invention.
Figure 5:
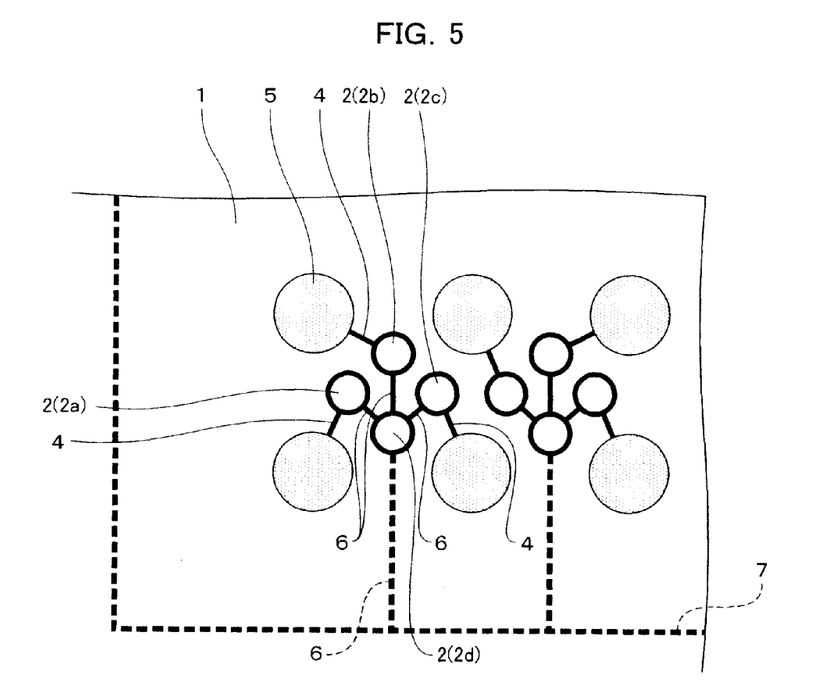
FIG. 5 is a partly enlarged plan view of the substrate according to Embodiment 2 of the present invention before wire cutting.
Figure 6:
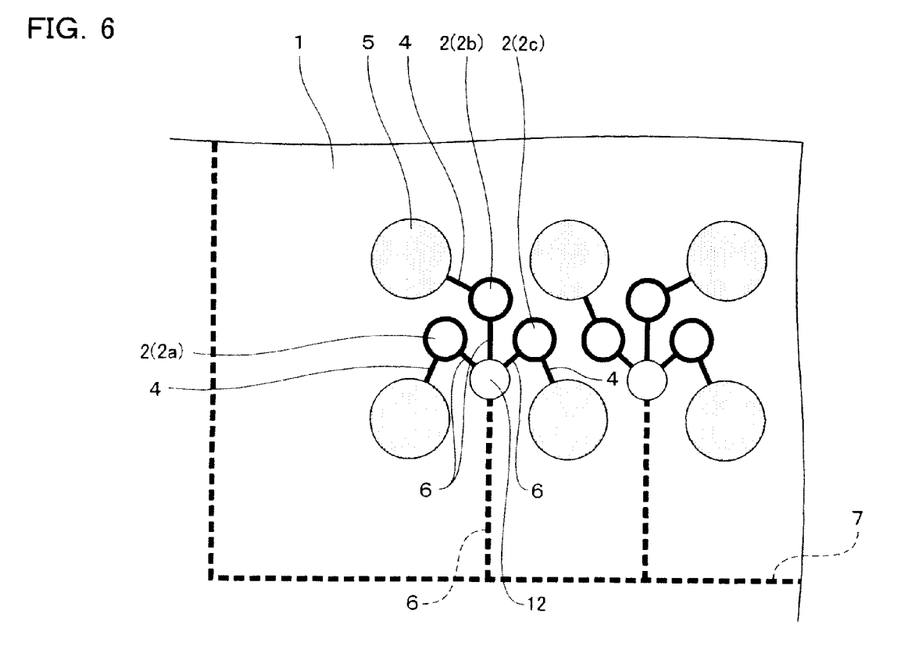
FIG. 6 is a partly enlarged plan view of the substrate according to Embodiment 2 of the present invention after the wire cutting.

FIG. 4 is a plan view showing the structure of the substrate according to Embodiment 2; the plan view shows a substrate portion in a region to be finally incorporated into one semiconductor device. FIG. 5 is a partly enlarged plan view of the substrate according to Embodiment 2 of the present invention before wire cutting. FIG. 6 is a partly enlarged plan view of the substrate according to Embodiment 2 of the present invention after the wire cutting.

Embodiment 2 is an applied example of Embodiment 1 and thus uses the same basic configuration as that in the process of forming the substrate 1. Thus, only differences from Embodiment 1 will be described.

In Embodiment 1, the through-hole 2a, 2b, 2c side of the wire 6 for plating connected to the outer peripheral wire 7 for plating includes the portion in which the wire 6 for plating branches at one position in the middle thereof. However, in Embodiment 2, as shown in FIG. 5, an outer peripheral wire 7 for plating side of the wire 6 for plating and the outer peripheral wire 7 for plating are arranged on the first surface (a portion shown by a dotted line). The through-hole 2a, 2b, 2c side (a portion shown by a solid line) of the wire 6 for plating is located on the second surface. Thus, a through-hole 2d is formed so as to electrically connect the first surface side and the second surface side together. The collectively arranged through-holes 2a, 2b, and 2c are connected to the through-hole 2d on the second surface side through the wire 6 for plating (the portion shown by the solid line).

Subsequently, as shown in FIGS. 4 and 6, a penetrating hole 12 with a larger diameter than the through-hole 2d is formed to prevent possible electric conduction among the wire 6 for plating on the first surface side (the portion shown by the dotted line) and the through-holes 2a, 2b, and 2c as is the case with Embodiment 1.

Embodiment 3

A substrate and a method of manufacturing the substrate according to Embodiment 3 of the present invention will be described.

Figure 7:
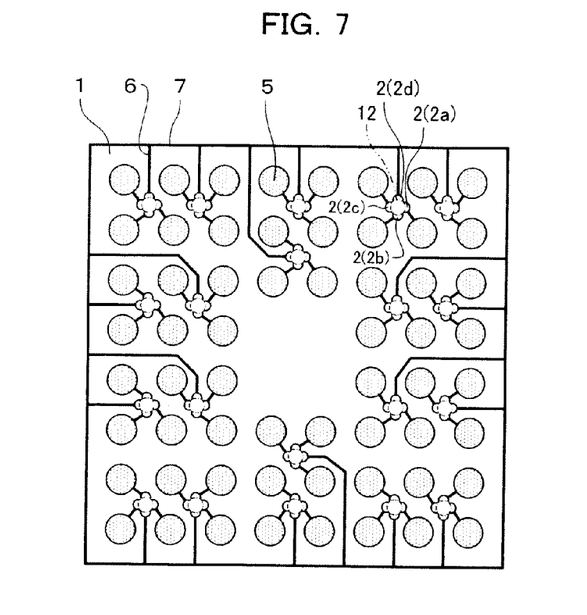
FIG. 7 is a plan view showing the structure of a substrate according to Embodiment 3 of the present invention.
Figure 8:
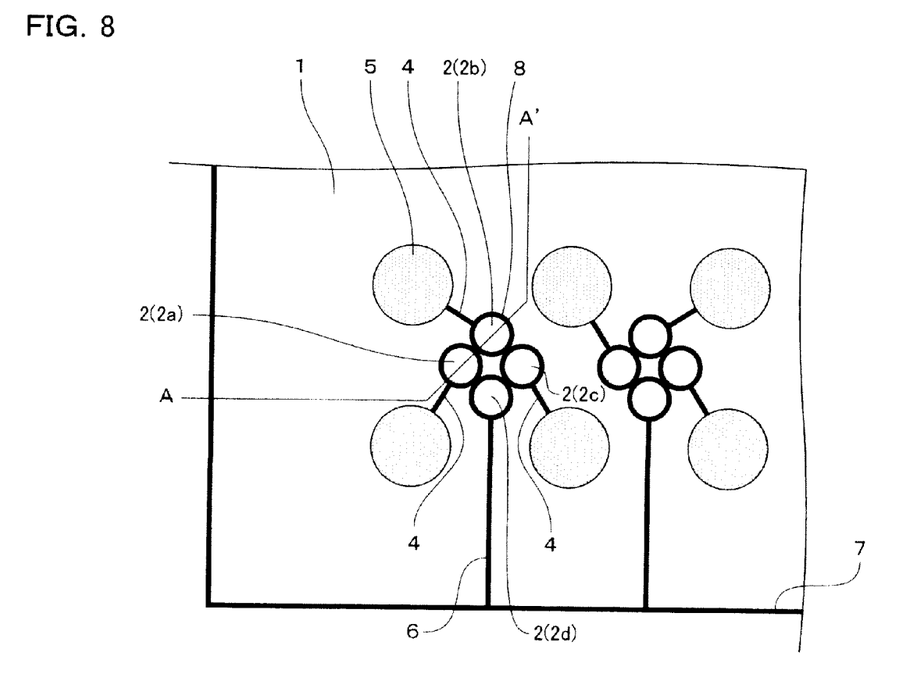
FIG. 8 is a partly enlarged plan view of the substrate according to Embodiment 3 of the present invention before wire cutting.
Figure 9:
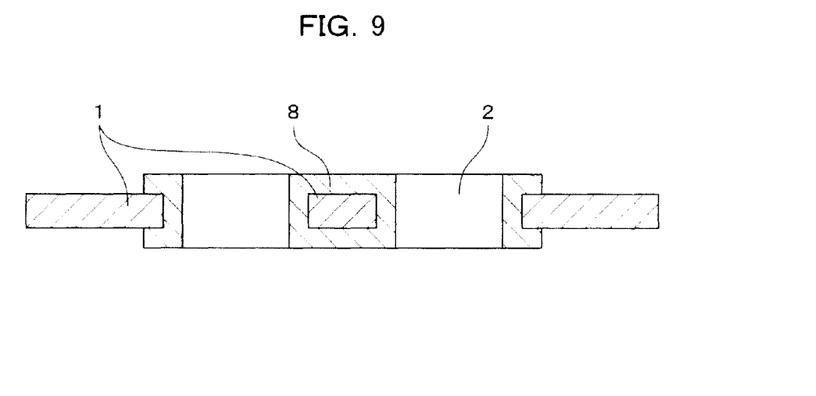
FIG. 9 is a sectional view showing the substrate according to Embodiment 3 of the present invention before the wire cutting, the view being taken along line A-A' in FIG. 8.
Figure 10:
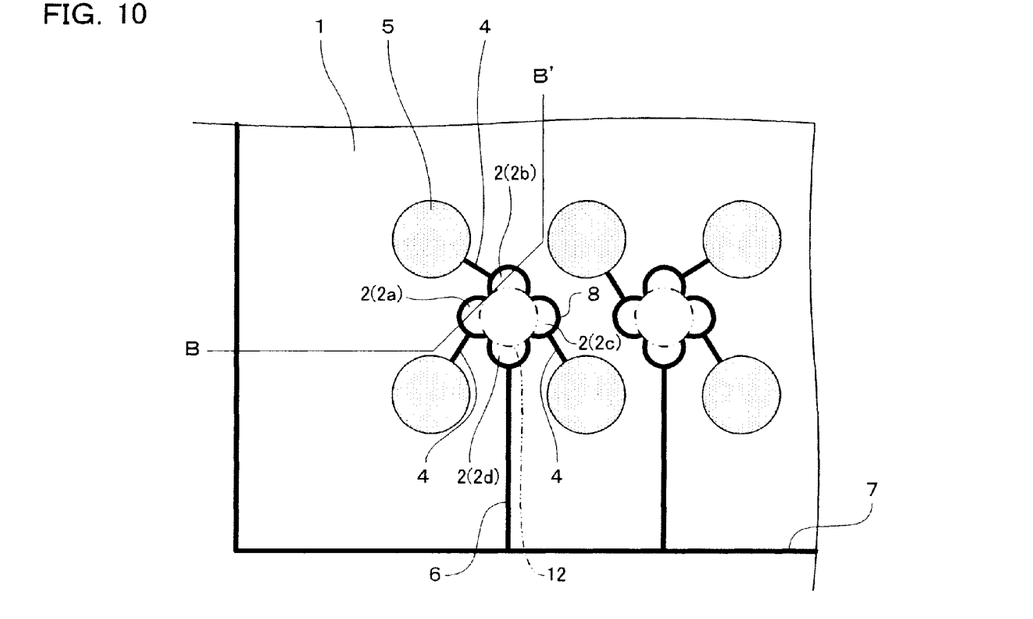
FIG. 10 is a partly enlarged plan view of the substrate according to Embodiment 3 of the present invention after wire cutting.
Figure 11:
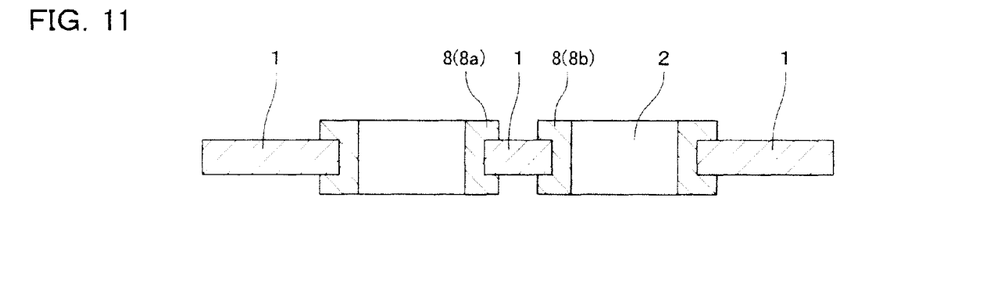
FIG. 11 is a sectional view of the substrate according to Embodiment 3 of the present invention after the wire cutting, the view being taken along line B-B' in FIG. 10.

FIG. 7 is a plan view showing the structure of the substrate according to Embodiment 3; the plan view shows a substrate portion in a region to be finally incorporated into one semiconductor device. FIG. 8 is a partly enlarged plan view of the substrate according to Embodiment 3 of the present invention before wire cutting. FIG. 9 is a sectional view of the substrate according to Embodiment 3 of the present invention before the wire cutting, the view being taken along line A-A' in FIG. 8. FIG. 10 is a partly enlarged plan view of the substrate according to Embodiment 3 of the present invention after the wire cutting. FIG. 11 is a sectional view of the substrate according to Embodiment 3 of the present invention after the wire cutting, the view being taken along line B-B' in FIG. 10.

Embodiment 3 also uses the same basic configuration as that in the process of forming the substrate according to Embodiment 1. Thus, only differences from Embodiment 1 will be described.

First, as shown in FIG. 8, the through-holes 2a, 2b, and 2c are collectively arranged on the second surface in the vicinity of the respective external terminal electrodes 5 so that the through-holes 2a, 2b, and 2c are surrounded by the adjacent external terminal electrodes 5 and so that through-hole lands 8 of adjacent ones of the through-holes 2a, 2b, and 2c are electrically connected together. This reduces the distance between each of the through-holes 2a, 2b, and 2c and the external terminal electrode 5 connected to the through-hole through the conducting wire 4. Moreover, to allow the wire 6 for plating connected to the outer peripheral wire 7 for plating to be connected to the collectively arranged through-holes 2a, 2b, and 2c, a through-hole 2d is located at the end of the wire 6 for plating on the through-hole 2a, 2b, 2c side so that a through-hole land 8 of the through-hole 2d is electrically connected to the through-hole lands 8 of both adjacent through-holes.

The thus collectively arranged through-holes 2a, 2b, 2c, and 2d are arranged such that when centers of the adjacent through-holes 2 are connected together with lines, the lines form a square if the four through-holes 2 are arranged, and form a regular triangle if the three through-holes 2 are arranged.

The arrangement of the through-holes 2a, 2b, 2c, and 2d is such that the through-hole lands 8, provided around outer peripheries of the respective through-holes 2a, 2b, 2c, and 2d, are arranged so that the through-hole lands 8 of the adjacent through-holes 2 are electrically connected together.

As a typical example of the substrate according to Embodiment 3, a case in which the four through-holes 2 are arranged in the substrate will be described.

As shown in FIG. 8, the collectively arranged through-holes 2a, 2b, 2c, and 2d are electrically connected together by the through-hole lands 8, formed around the respective through-holes 2, with the substrate 1 left midway between opposite ones of the through-holes 2. FIG. 9 shows a structure condition of the through-hole lands 8 (for example, a cross section A-A' between the through-holes 2a and 2b) of the adjacent through-holes 2.

Thereafter, as shown in FIGS. 7 and 10, the penetrating hole 12 (a portion shown by an alternate long and two short dashes line) is formed midway between the opposite ones of the through-holes 2 to separate the collectively arranged through-holes 2a, 2b, 2c, and 2d from one another so that no electric conduction occurs between the through-holes 2. Then, a connection point portion between the adjacent through-hole lands 8 and the substrate 1 left midway between the opposite through-holes is cut off. FIG. 11 shows a separation structure condition of the through-hole lands 8 of the adjacent through-holes 2 (for example, a cross section B-B' between the through-hole lands 8a and 8b of the through-holes 2a and 2b).

When the wires on the substrate with a thickness of 0.5 mm or less are cut and separated from one another using the penetrating hole, the substrate can be efficiently produced without any processing error or displacement by using a process of forming the penetrating hole that electrically disconnects the wire for plating from the through-holes, particularly laser processing.

What is claimed is:

1. A method of manufacturing a substrate, comprising the steps of:

forming, on a first surface of a substrate, a plurality of internal terminals and a first conducting wire for electric connection to the internal terminals, forming, on a second surface of the substrate opposite to the first surface, a plurality of external terminal electrodes and a second conducting wire for electric connection to the external terminal electrodes, and forming a plurality of through-holes electrically connecting the first conducting wire to the second conducting wire, in a region surrounded by the external terminal electrodes so that the through-holes are collectively arranged in the region;

forming an outer peripheral wire for plating on a peripheral portion of the substrate, forming at least one wire for plating extending from the outer peripheral wire for plating to electrically connect the outer peripheral wire for plating and the collectively arranged plurality of through-holes together so that the wire for plating is connected to the through-holes at one position thereof, and electrically connecting the outer peripheral wire for plating, the first conducting wire and the second conducting wire together through the wire for plating and then subjecting the outer peripheral wire for plating, the first conducting wire, the second conducting wire and the wire for plating to electroplating; and forming a penetrating hole at the one position of the wire for plating and cutting the one position off to make the wire for plating and the collectively arranged plurality of through-holes independent of each other as different wires so that no electric conduction occurs among the wire for plating and the through-holes.

2. The method of manufacturing a substrate according to claim 1, wherein the step of forming the at least one wire for plating so that the at least one wire for plating is connected to the through holes at the one position thereof is:

forming the at least one wire for plating so that the at least one wire for plating branches at the one position in a middle of the wire and then connects to the respective through-holes, and the step of forming the penetrating hole at the one position of the wire for plating and cutting the one position off is:

forming the penetrating hole in the branching portion of the wire for plating and cutting the branching portion off.

3. The method of manufacturing a substrate according to claim 2, wherein the penetrating hole is formed by drilling so that an inner diameter of the penetrating hole is equivalent to or larger than a through-hole diameter.

4. The method of manufacturing a substrate according to claim 3, wherein the penetrating hole is formed in the substrate with a thickness of 0.5 mm or less.

5. The method of manufacturing a substrate according to claim 2, wherein the penetrating hole is formed by laser processing so that an inner diameter of the penetrating hole is equivalent to or larger than a through-hole diameter.

6. The method of manufacturing a substrate according to claim 1, wherein the step of forming the at least one wire for plating so that the at least one wire for plating is connected to the through holes at the one position thereof is:

forming the at least one wire for plating such that one of the through-holes is connected to a wiring end of the wire for plating and such that a through-hole land of the one of the through-holes is connected to through-hole lands of the other through-holes connected to the external terminal electrodes and located adjacent to the one of the through-holes so that the wire for plating is connected to the through-holes at the one position thereof, and the step of forming the penetrating hole at the one position of the wire for plating and then cutting the one position off is:

forming the penetrating hole in a region extending from a central position among all the through-holes connected to the wire for plating to an outer periphery of junction portions between the through-hole lands, and then cutting the central portion among all the through-holes.

7. The method of manufacturing a substrate according to claim 3, wherein the penetrating hole is formed by drilling so that an inner diameter of the penetrating hole is equivalent to or larger than a through-hole diameter.

8. The method of manufacturing a substrate according to claim 7, wherein the penetrating hole is formed in the substrate with a thickness of 0.5 mm or less.

9. The method of manufacturing a substrate according to claim 6, wherein the penetrating hole is formed by laser processing so that an inner diameter of the penetrating hole is equivalent to or larger than a through-hole diameter.

10. The method of manufacturing a substrate according to claim 1, wherein the penetrating hole is formed by drilling so that an inner diameter of the penetrating hole is equivalent to or larger than a through-hole diameter.

11. The method of manufacturing a substrate according to claim 10, wherein the penetrating hole is formed in the substrate with a thickness of 0.5 mm or less.

12. The method of manufacturing a substrate according to claim 1, wherein the penetrating hole is formed by laser processing so that an inner diameter of the penetrating hole is equivalent to or larger than a through-hole diameter.

13. A substrate manufactured by the method of manufacturing a substrate according to claim 1, wherein the substrate comprises a penetrating hole formed at one position of the wire for plating after an electroplating process carried out through the outer peripheral wire for plating, and the wire for plating and the collectively arranged plurality of through-holes are made independent of one another as different wires so that no electric conduction occurs among the wire for plating and the through-holes.

14. A substrate manufactured by the method of manufacturing a substrate according to claim 1, wherein the substrate comprises a penetrating hole formed at one position of the wire for plating after an electroplating process carried out through the outer peripheral wire for plating, and the wire for plating and the collectively arranged plurality of through-holes are made independent of one another as different wires so that no electric conduction occurs among the wire for plating and the through-holes.

15. A method of manufacturing a substrate, comprising the steps of:

forming, on a first surface of a substrate, a plurality of internal terminals and a first conducting wire for electric connection to the internal terminals, forming, on a second surface of the substrate opposite to the first surface, a plurality of external terminal electrodes and a second conducting wire for electric connection to the external terminal electrodes, and forming a plurality of first through-holes electrically connecting the first conducting wire to the second conducting wire, in a region surrounded by the external terminal electrodes so that the first through-holes are collectively arranged in the region;

forming an outer peripheral wire for plating on a peripheral portion of the first surface, forming at least one wire for plating extending from the outer peripheral wire for plating to electrically connect the outer peripheral wire for plating and the collectively arranged plurality of first through-holes together so that the wire for plating branches on the second surface at one position in a middle of the wire via a second through-hole and then connects to the respective first through-holes, and electrically connecting the outer peripheral wire for plating, the first conducting wire and the second conducting wire together through the wire for plating and then subjecting the outer peripheral wire for plating, the first conducting wire, the second conducting wire and the wire for plating to electroplating; and forming a penetrating hole in the second through-hole portion of the wire for plating and cutting the second through-hole portion off to make the wire for plating and the collectively arranged plurality of first through-holes independent of each other as different wires so that no electric conduction occurs among the wire for plating and the first through-holes.

16. The method of manufacturing a substrate according to claim 15, wherein the penetrating hole is formed by drilling so that an inner diameter of the penetrating hole is equivalent to or larger than a through-hole diameter.

17. The method of manufacturing a substrate according to claim 16, wherein the penetrating hole is formed in the substrate with a thickness of 0.5 mm or less.

18. The method of manufacturing a substrate according to claim 15, wherein the penetrating hole is formed by laser processing so that an inner diameter of the penetrating hole is equivalent to or larger than a through-hole diameter.

19. A substrate manufactured by the method of manufacturing a substrate according to claim 15, wherein the substrate comprises a penetrating hole formed in the second through-hole portion of the wire for plating after an electroplating process carried out through the outer peripheral wire for plating, and the wire for plating and the collectively arranged plurality of first through-holes are made independent of one another as different wires so that no electric conduction occurs among the wire for plating and the first through-holes.

* * * * *